United States Patent
Wu et al.

(10) Patent No.: US 6,958,906 B2
(45) Date of Patent: Oct. 25, 2005

(54) METHOD AND APPARATUS FOR COOLING A MODULAR COMPUTER SYSTEM WITH DUAL PATH AIRFLOW

(76) Inventors: Shan Ping Wu, 134 Linden Ave., Westbury, NY (US) 11590; Shan Hua Wu, 134 Linden Ave., Westbury, NY (US) 11590

( * ) Notice: Subject to any disclaimer, the term of this patent is extended or adjusted under 35 U.S.C. 154(b) by 0 days.

(21) Appl. No.: 10/412,841

(22) Filed: Apr. 11, 2003

(65) Prior Publication Data

US 2004/0201957 A1 Oct. 14, 2004

(51) Int. Cl.$^7$ ................................................. G06F 1/20
(52) U.S. Cl. ..................... 361/687; 361/690; 165/80.1; 174/15.1
(58) Field of Search ................................. 361/687–688, 361/690–695; 165/80.1–80.3, 164, 166, 168–170; 174/15.1, 16.1

(56) References Cited

U.S. PATENT DOCUMENTS

| | | | | |
|---|---|---|---|---|
| 5,173,819 A | * | 12/1992 | Takahashi et al. | ........ 360/97.03 |
| 5,218,514 A | * | 6/1993 | Huynh et al. | ................ 361/683 |
| 5,430,607 A | | 7/1995 | Smith | |
| 5,546,272 A | | 8/1996 | Moss et al. | |
| 5,572,403 A | | 11/1996 | Mills | |
| 6,058,011 A | | 5/2000 | Hardt et al. | |
| 6,129,429 A | | 10/2000 | Hardt et al. | |
| 6,271,604 B1 | | 8/2001 | Frank, Jr. et al. | |
| 6,297,955 B1 | | 10/2001 | Frank, Jr. et al. | |
| 6,359,779 B1 | | 3/2002 | Frank, Jr. et al. | |
| 6,389,499 B1 | | 5/2002 | Frank, Jr. et al. | |
| 6,411,522 B1 | | 6/2002 | Frank, Jr. et al. | |
| 6,437,980 B1 | | 8/2002 | Casebolt | |
| 6,468,150 B1 | | 10/2002 | Langdon et al. | |
| 6,496,366 B1 | * | 12/2002 | Coglitore et al. | ........... 361/687 |
| 6,525,935 B2 | | 2/2003 | Casebolt | |
| 6,535,384 B2 | | 3/2003 | Huang | |
| 6,819,560 B2 | * | 11/2004 | Konshak et al. | ............ 361/687 |
| 2002/0015287 A1 | * | 2/2002 | Shao | |
| 2002/0105786 A1 | | 8/2002 | Della Fiora et al. | |
| 2003/0016515 A1 | | 1/2003 | Jackson et al. | |
| 2003/0030975 A1 | | 2/2003 | Bestwick et al. | |
| 2003/0030976 A1 | | 2/2003 | Garnett et al. | |
| 2003/0030977 A1 | | 2/2003 | Garnett et al. | |
| 2003/0030978 A1 | | 2/2003 | Garnett et al. | |
| 2003/0031189 A1 | | 2/2003 | Larson et al. | |
| 2003/0033366 A1 | | 2/2003 | Garnett et al. | |
| 2003/0033460 A1 | | 2/2003 | King et al. | |
| 2003/0042003 A1 | | 3/2003 | Novotny et al. | |
| 2003/0042004 A1 | | 3/2003 | Novotny et al. | |

\* cited by examiner

Primary Examiner—Yean-Hsi Chang
(74) Attorney, Agent, or Firm—Hoffmann & Baron, LLP

(57) ABSTRACT

A computer system and a method for cooling the system incorporate removable modules within a housing. The housing includes a parallelepiped structure with at least four walls. The four walls include at least two sets of opposing walls. Both walls of one set of opposing walls include opposing first and second openings substantially aligned with each other to allow passage of a cooling medium therethough. The module is receivable through a third opening in the parallelepiped structure and includes an electrical component region. The housing includes a first airflow path in-line with the third opening and a second airflow path between the first opening and the second opening. The first airflow path and the second airflow path are directed across the component region of the module when the module is received within the housing.

53 Claims, 13 Drawing Sheets

METHOD AND APPARATUS FOR COOLING A MODULAR COMPUTER SYSTEM WITH DUAL PATH AIRFLOW

BACKGROUND OF THE INVENTION

1. Field of the Invention

The present invention generally relates to a free-standing or rack-mountable chassis with computer modules or blades slidably received therein, and more particularly to such a chassis that enables components associated with these modules to be cooled by at least two airflow paths.

2. Description of the Prior Art

Cooling computer systems has always been a problem. The form-factor of the chassis, "hot pluggable" components, and the demand for improved reliability of client/server network systems, with ever-increasing microprocessor power dissipation and system power consumption, have created additional problems with cooling system design, particularly with respect to temperature monitoring and control. High-end servers utilize newer high powered processors, as well as multiple processors, thereby creating even more heat within the system.

Typically, microprocessors and associated electronic components are cooled by forced air. That is, fans are used to push or pull air from one side of a chassis housing electrical components, across the electrical components and out the other side of the chassis. By forcing air to flow over the electrical components, heat is dissipated, which prevents the electrical components from overheating and failing.

Cooling electrical components with air is limited by the ability to channel or direct the airflow through the chassis and across the electrical components housed therein. Air follows the path of least resistance, and in many cases, the path of least resistance does not cross the electrical components that most need cooling. Thus, large volumes of air may be pulled through a chassis without ever cooling certain electrical components. The end result being that the electrical components overheat and the computer system fails.

Existing systems include barriers throughout the chassis that direct airflow through the chassis. These barriers, however, are generally designed around certain configurations of electrical components within the chassis, that is, specific electrical components function as airflow barriers. The component configurations are often altered when particular components are added or removed. By removing or adding new components, the preferred airflow through the chassis is disturbed and air may stop flowing in particular areas of the chassis. These areas are commonly referred to as "dead spots".

A particular problem exists with respect to preventing dead spots around power supplies and disk drives on computer motherboards since airflow is generally designed to be directed across these components. Because of the arrangement and placement of the power supply and disk drives at the rear of a motherboard, the height of these assemblies, and conventional airflow paths, dead spots are created between the power supply, disk drives, and the front of the chassis.

Unfortunately, this is precisely where high performance microprocessors are located in standard ATX form-factor motherboards. These processors dissipate a large amount of heat while being critical to the operation of the system. In addition, the power supply and disk drives generate relatively large amounts of heat, and may thus cause a particular module and/or component to fail.

Because the failure of any electrical component, but most particularly the processor or processors, disrupts the operation of the computer system, it is essential that the computer chassis provide high efficiency cooling, cool all electrical components housed within the chassis, and minimize system down time with respect to different electrical component configurations, whether they be the standard ATX, Micro-ATX, ITX, Mini-ITX, or LPX form-factors or an open non-proprietary standard.

OBJECTS AND SUMMARY OF THE INVENTION

It is an object of the present invention to provide a method, chassis, and module that promote efficient, effective, uniform, and thorough cooling of all components within a computer system.

It is another object of the present invention to provide a method, chassis, and module that eliminate dead spots in conventional airflow paths commonly created around oversized or high profile components and assemblies, such as power supplies and disk drives, in computer systems.

It is yet another object of the present invention to provide a method, chassis, and module that provide for dual airflow paths to cool all components mounted on removable modules within the chassis.

It is still another object of the present invention to provide a method, chassis, and module that create an airflow path or chimney through a plurality of chassis stacked or cascaded in vertical alignment.

A computer system formed in accordance with one form of the present invention, which incorporates some of the preferred features, includes a housing and a module. The housing includes a parallelepiped structure with at least four walls. The four walls include at least two sets of opposing walls. Both walls of one set of opposing walls include opposing first and second openings substantially aligned with each other to allow passage of a cooling medium therethough.

The module is receivable through a third opening in the parallelepiped structure, and includes a component region adapted for positioning at least one electrical component therein. The housing includes a first airflow path in-line with the third opening, and a second airflow path between the first opening and the second opening. The first airflow path and the second airflow path are directed across the component region of the module when the module is received within the housing.

A method of cooling a computer system formed in accordance with one form of the present invention, which incorporates some of the preferred features, includes the steps of forming a housing including a parallelepiped structure with at least four walls including at least two sets of opposing walls, and forming opposing openings substantially aligned with each other on both walls of one set of opposing walls for passage of a cooling medium therethrough.

The method further includes the steps of providing a module receivable through a third opening in the parallelepiped structure, providing a component region on the module adapted for positioning at least one electrical component therein, providing a first airflow path substantially in-line with the third opening, and providing a second airflow path substantially between the first opening and the second opening. The first airflow path and the second airflow path are directed across the component region of the module when the module is received within the housing.

These and other objects, features, and advantages of this invention will become apparent from the following detailed

DETAILED DESCRIPTION OF THE PREFERRED EMBODIMENTS

Figure 1:
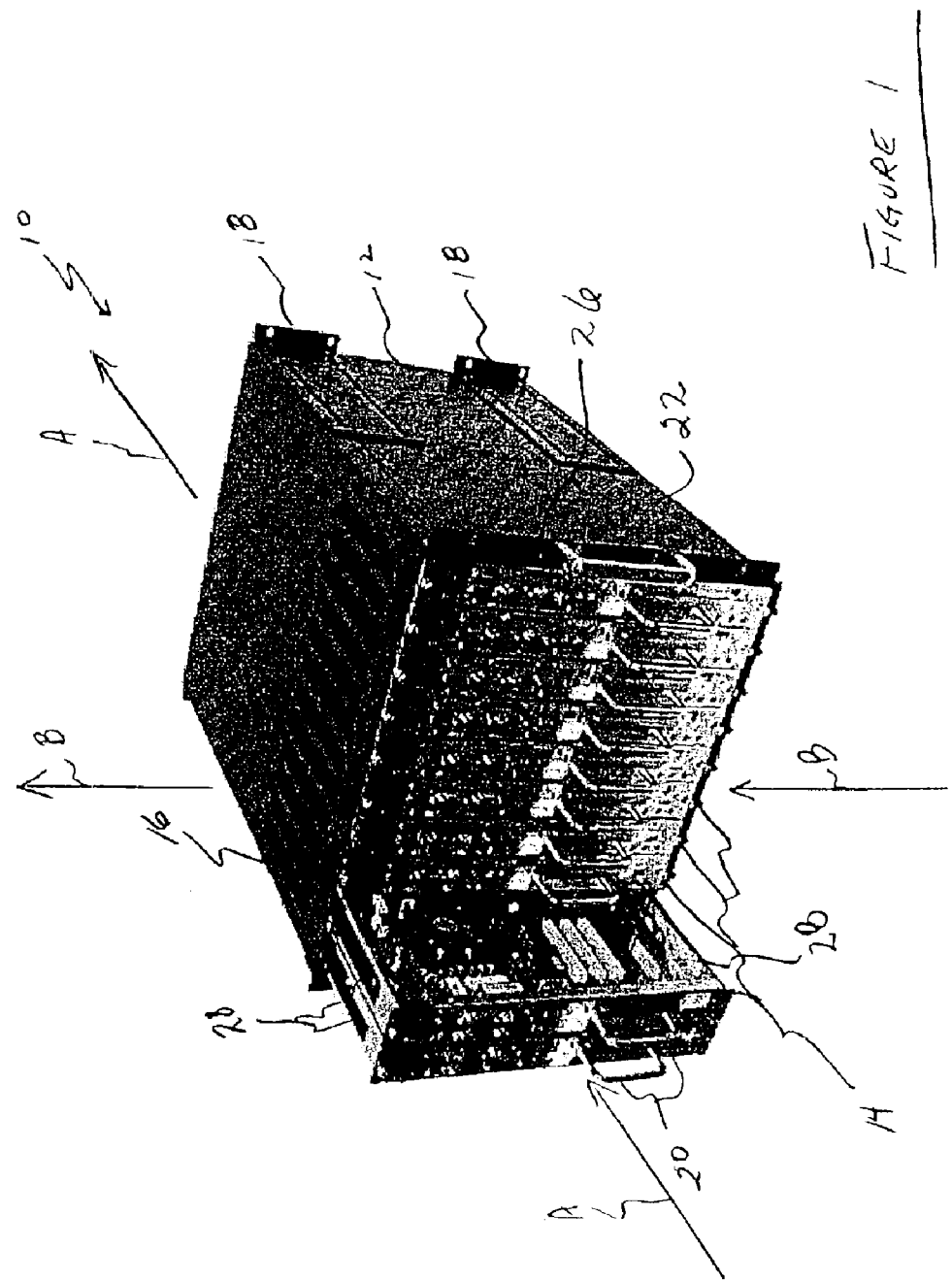
FIG. 1 is a front pictorial view of a computer system including a chassis and removable modules formed in accordance with the present invention.

FIG. 1 is a front pictorial view of a computer system 10, which includes a computer chassis or housing 12 and modules 14 formed in accordance with the present invention. The modules 14 are preferably slidably removable from the chassis 12. The modules 14 or blades are preferably provided in various configurations, such as:

1. a computer blade module, which supports a standard ATX/Micro ATX mother board, two (2) standard 3½ inch form-factor hard disk drives, and single or dual high-speed processors;
2. a storage blade module, which supports six (6) standard 3½ inch form-factor hard disk drives;
3. a communication blade module, which supports multiple communication devices; and
4. a control blade module, which supports multiple industrial controller devices.

Each of the modules 14 preferably includes the following features:

1. tool-less thumbscrew module locking within the chassis;
2. front-accessible power switching;
3. front-accessible power connectors, which enable rapid power source disconnection;
4. front-accessible input/output (I/O) connectors, which include video, local area network (LAN), keyboard, mouse, serial, universal serial bus (USB), small computer system interface (SCSI), integrated drive electronics (IDE), fibre channel, and advanced technology attachment (ATA) ports;
5. front-accessible peripheral component interconnect (PCI) expansion slots; and
6. a self-contained power supply.

Figure 12:
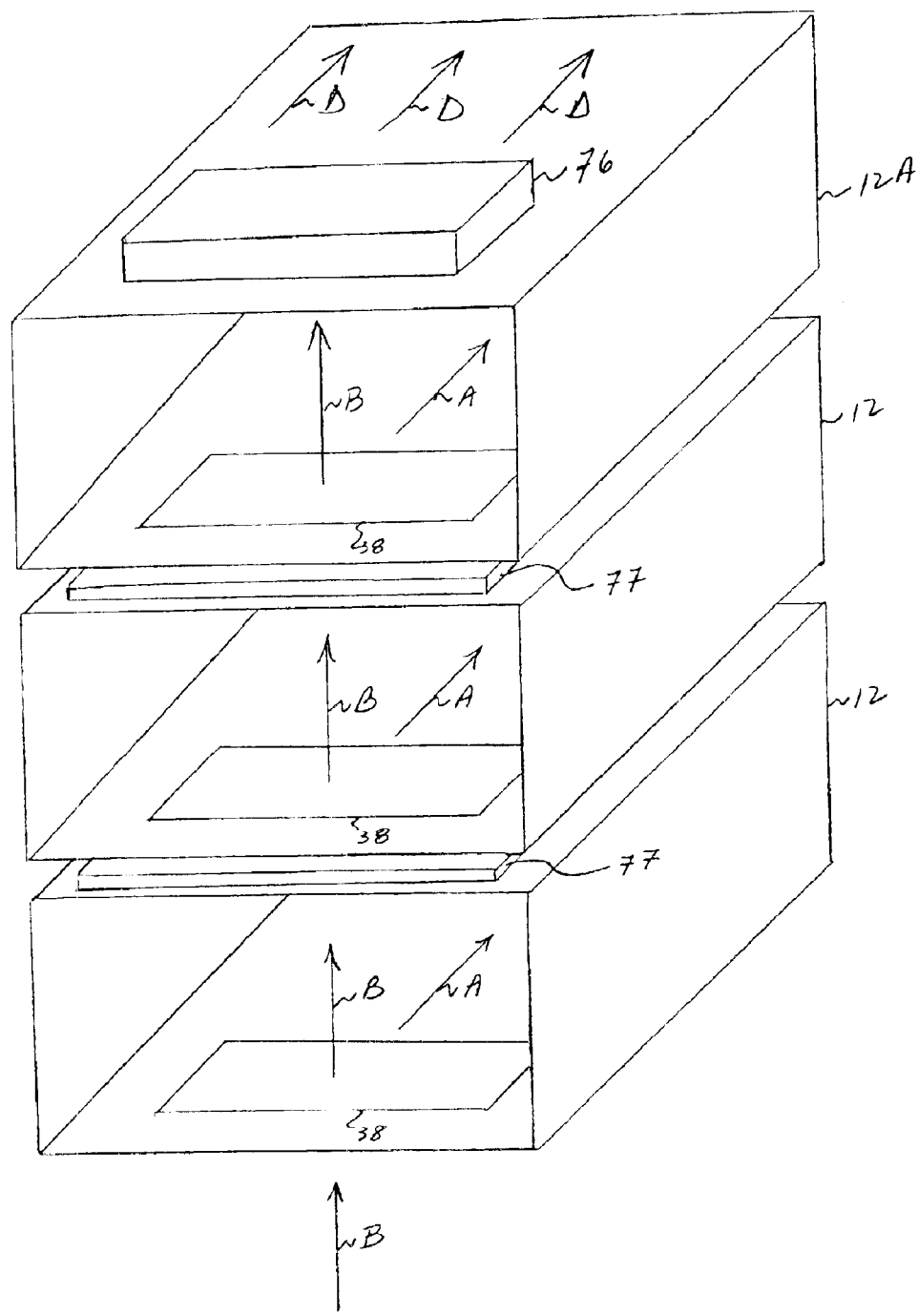
FIG. 12 is an isometric view of a plurality of chassis stacked in vertical alignment.

The chassis 12 preferably supports ten (10) independently operated pluggable blade modules 14, and preferably includes perforated vent panels 16 that can be removed from both the top and bottom of the chassis 12. The chassis 12 is preferably configured as a stand-alone unit or mounted in vertical alignment as shown in FIG. 12 within, for instance, a rack (not shown) using rear ear brackets 18. Handles 20, 22 are preferably mounted on both the modules 14 and the chassis 12 to aid in their handling and relocation.

Figure 2:
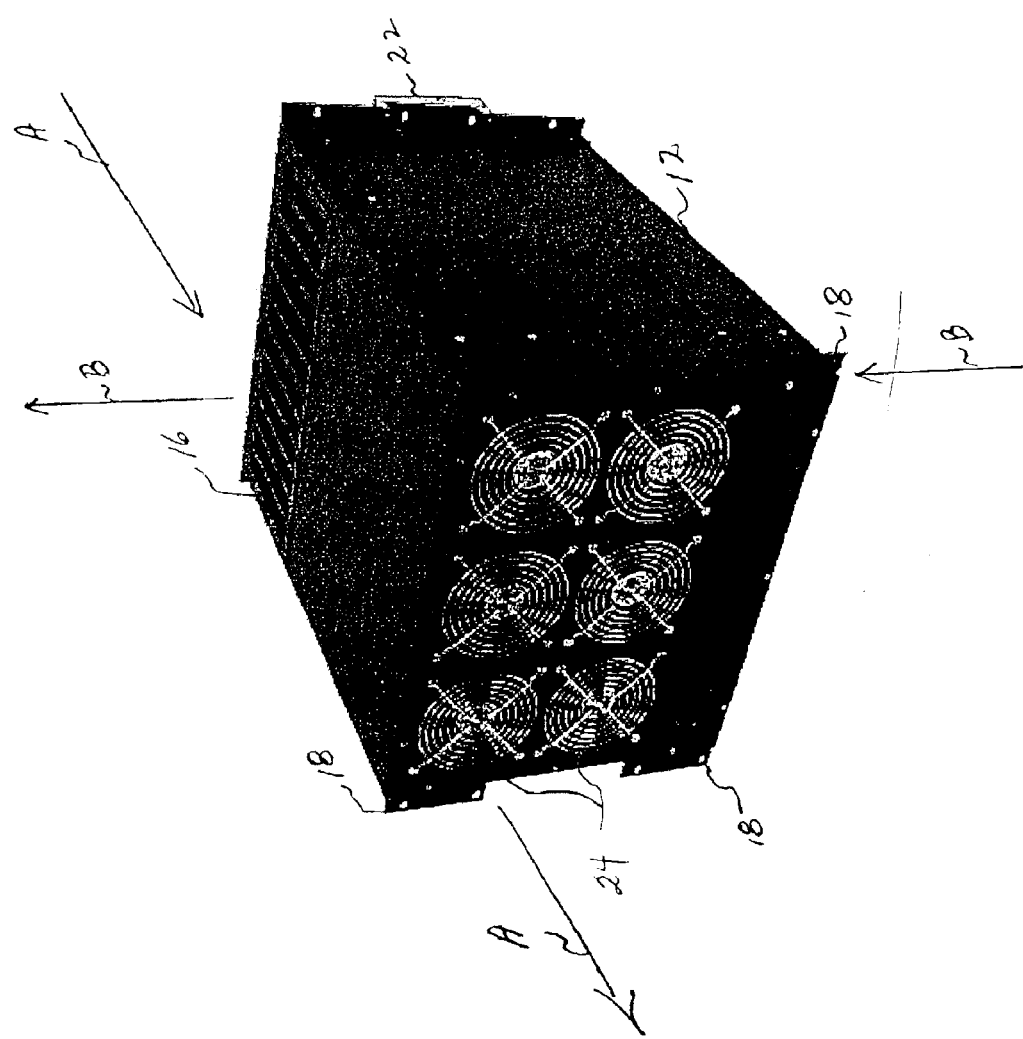
FIG. 2 is a rear pictorial view of the computer chassis formed in accordance with the present invention.

FIG. 2 shows a rear pictorial view of the chassis 12. The chassis 12 preferably includes six (6) rear-mounted heat exhausting fans 24, which provide about 72 CFM. The fans 24 preferably draw air from a front region of the chassis 12, into which the modules are inserted, towards a rear portion of the chassis 12, from which the hot air is exhausted.

The chassis 12 and modules 14 formed in accordance with the present invention support at least two independent airflow paths. A first or horizontal airflow path, which is indicated in FIGS. 1 and 2 by arrow A, is preferably directed through a front vent 26, which is preferably located on each of the modules 14, across the modules 14, out a rear vent of the modules 14, and exits the chassis 12 through the rear-mount fans 24.

A second or vertical airflow path, which is indicated in FIGS. 1 and 2 by arrow B, is preferably directed from the vent panel at the bottom of the chassis 12, through a lateral vent 28 of the modules 14 across the modules 14, out an opposing lateral vent 28 of the modules 14, and exits a top region of the chassis 12 at the vent panel 16. Thus, the chassis 12 and removable modules 14 formed in accordance with the present invention provide at least two independent airflow paths to cool components on each of the modules while substantially eliminating dead spots created by oversized and/or high profile components and assemblies.

Figure 3:
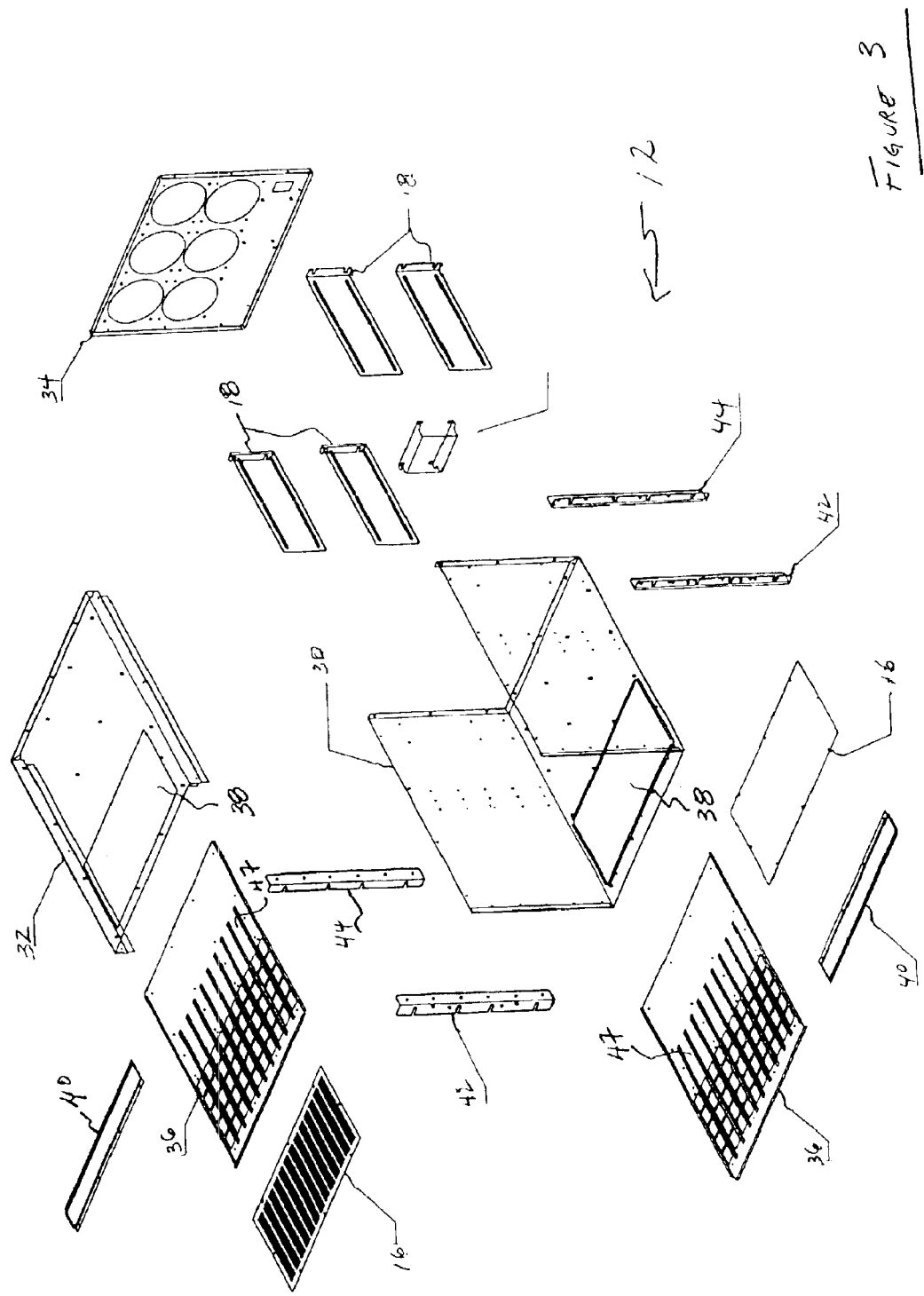
FIG. 3 is an exploded view of the chassis formed in accordance with the present invention.

FIG. 3 is an exploded view of the chassis 12 formed in accordance with the present invention. The chassis 12 preferably includes a bottom portion 30, which forms the bottom surface, left side, and right side of the chassis 12. The chassis also preferably includes a top cover 32, which mounts on top of the bottom portion 30, and a rear cover 34, which covers the rear portion of the chassis 12 and provides a mounting surface for the fans 24 shown in FIG. 2.

A pair of rear ear brackets 18 preferably mounts to each of the right and left sides of the chassis 12. Upper and lower housing slots 36 preferably mount to top and bottom internal surfaces of the chassis 12 and function to guide the modules as they are inserted and removed from the chassis 12. The bottom portion 30 and the top cover 32 both preferably include vents 38, which are preferably covered by perforated vent plates 16.

Stabilization bars 40 preferably mount to the front portions of the top cover 32 and the bottom portion 30 to add rigidity to the front of the chassis 12. Front ear brackets 42 and center mount ear brackets 44 preferably mount to the right and left sides of the chassis 12 to add further rigidity to the chassis 12 and to enable the chassis 12 to be mounted within a rack (not shown).

Figure 4:
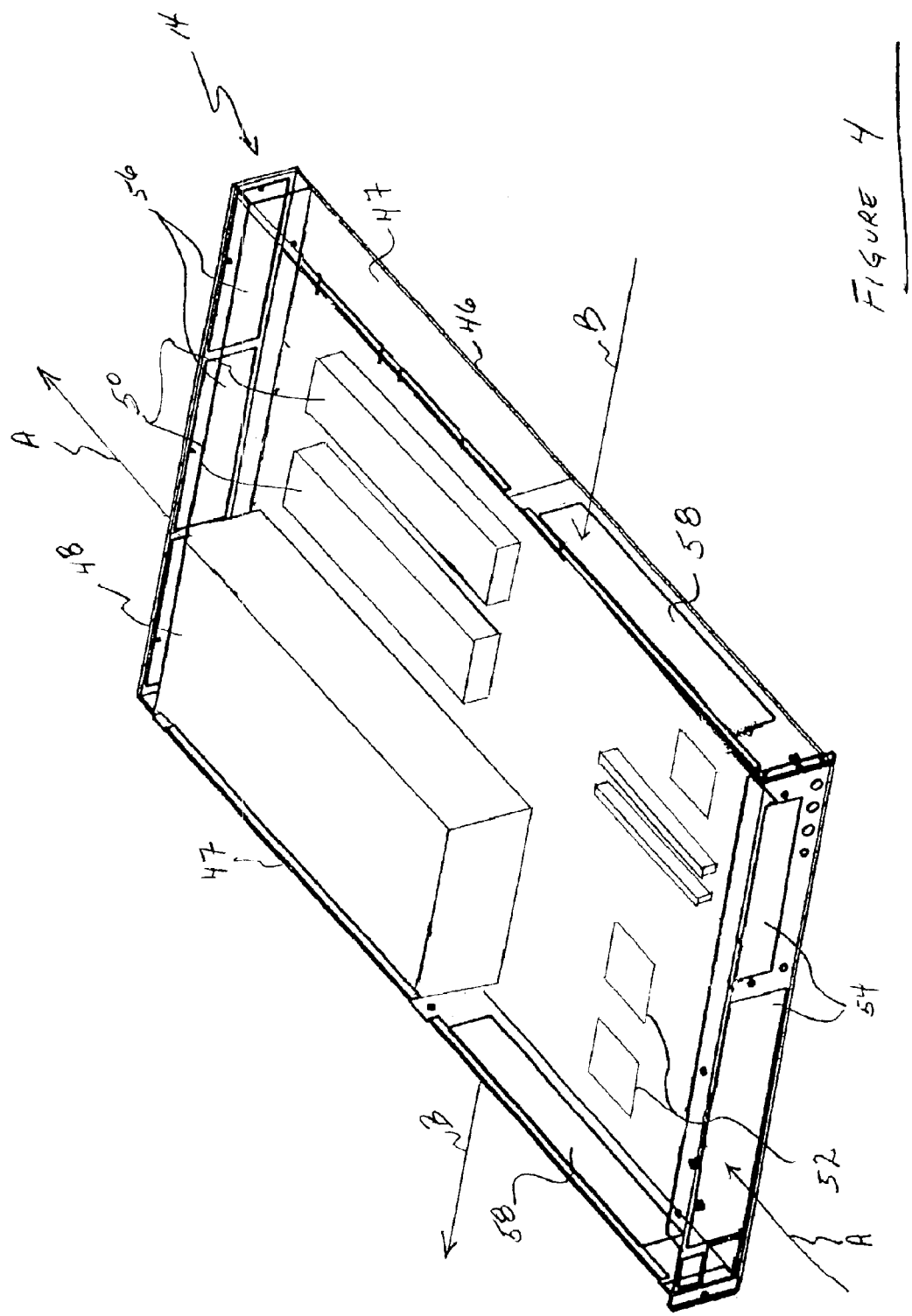
FIG. 4 is a top isometric view of a computer motherboard module formed in accordance with the present invention.
Figure 5:
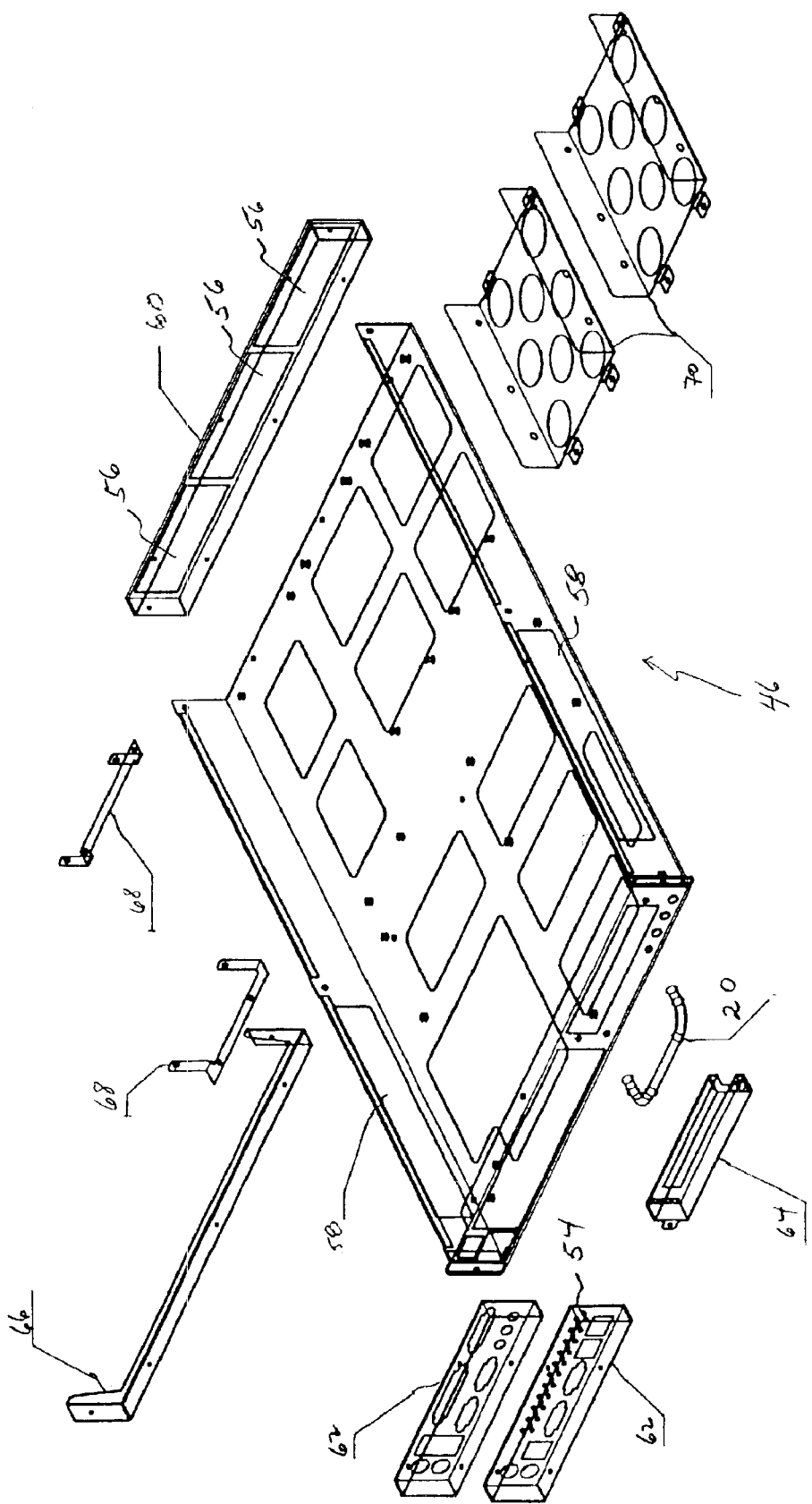
FIG. 5 is an exploded view of a first embodiment of the computer module formed in accordance with the present invention.

FIG. 4 shows a top isometric view of a standard ATX computer motherboard module 14 formed in accordance with the present invention. The module 14 preferably includes an external enclosure 46 to house electrical and/or electronic components mounted within the module, such as a power supply 48, disk drives 50, and microprocessors 52, while permitting electrical access to and cooling of these components.

The external enclosure 46 also preferably includes friction-reducing material 47, such as silicone and/or Teflon® tape, affixed to one or both sides of an external surface to enable the module 14 to slide freely when being removed or inserted into the chassis 12. Alternatively, or in addition, friction-reducing material 47 may be affixed to an internal surface of the chassis, such as on the upper and lower housing slots 36 for a similar purpose.

The external enclosure 46 includes front vents 54, rear vents 56, and lateral vents 58. As described above, the first airflow path, indicated by arrow A, preferably flows into the front vents 54, across the components housed in the enclosure 46, and exits the module 14 through the rear vents 56. The second airflow path, indicated by arrow B, preferably flows into one of the lateral vents 58, across the components housed within the enclosure 46, and exits the opposing lateral vent 58 of the module 14. The first and second airflow paths are preferably perpendicular with respect to each other, but are not required to be so while remaining within the scope of the present invention.

In a conventional chassis and module, the microprocessors 52 are located in a dead spot within the first airflow path A, which is created by oversized or high profile components and assemblies, such as the power supply 48 and disk drives 50 blocking the flow of air. However, presence of the second airflow path B advantageously provides an independent cooling mechanism for the high-performance microprocessors 52, as well as other components in this area, that eliminates dead spots in the first airflow path A.

Figure 6:
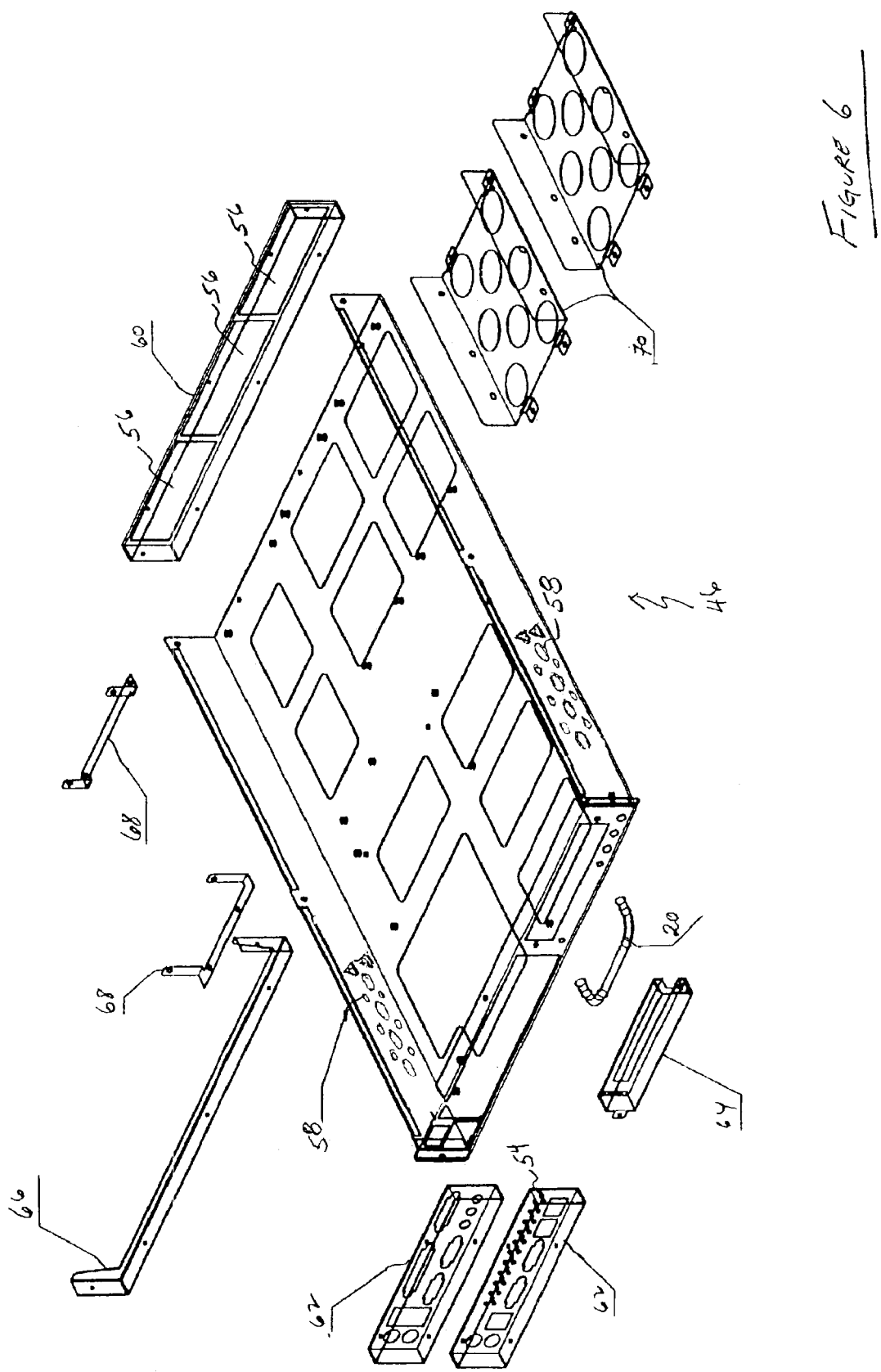
FIG. 6 is an exploded view of a second embodiment of the computer module formed in accordance with the present invention.

FIGS. 5–8 show exploded views of different embodiments of the external enclosure 46 of the module formed in accordance with the present invention. In a first embodiment, shown in FIG. 5, the lateral vents 58 are formed as rectangular cut-outs in the right and left side portions of the enclosure 46. FIG. 6 shows a second embodiment of the enclosure 46 wherein the lateral vents 58 are provided as substantially circular, triangular, or elliptical perforations.

Figure 7:
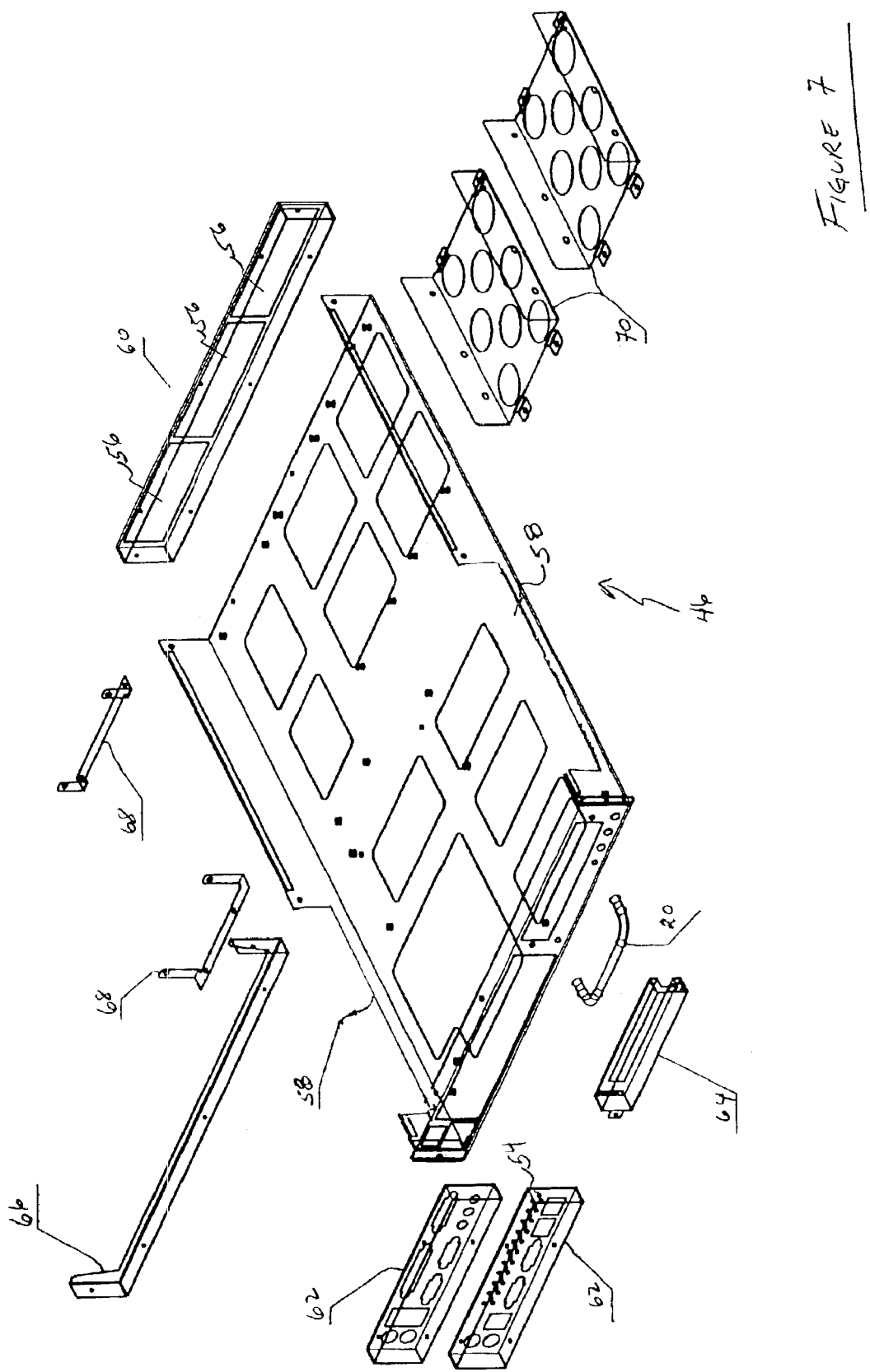
FIG. 7 is an exploded view of a third embodiment of the computer module formed in accordance with the present invention.
Figure 8:
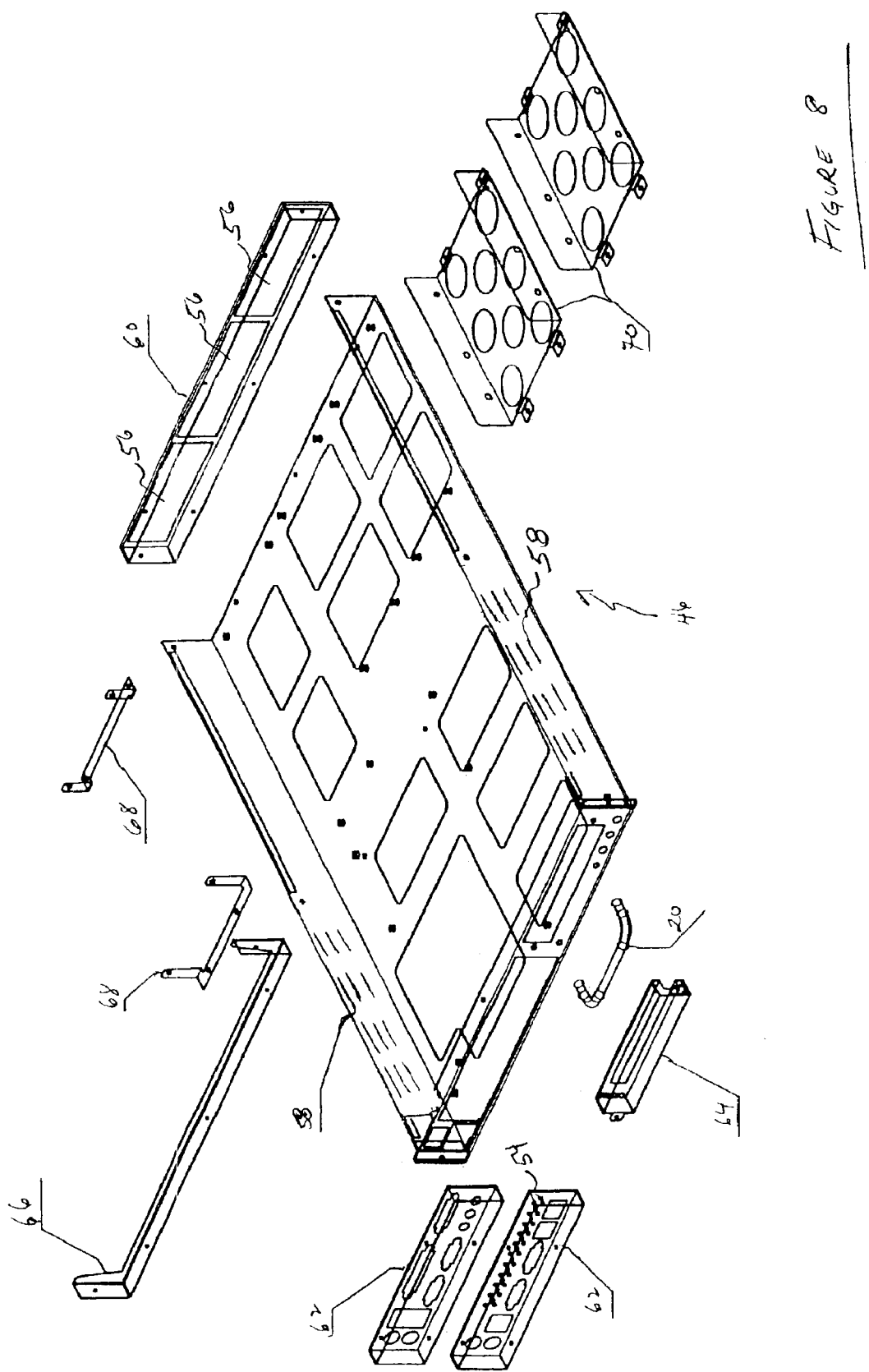
FIG. 8 is an exploded view of a fourth embodiment of the computer module formed in accordance with the present invention.

In a third embodiment of the enclosure 46 shown in FIG. 7, the lateral vents 58 of the enclosure 46 are formed by removing an oblong portion of both the right and left sides of the enclosure 46. In a fourth embodiment of the enclosure 46 shown in FIG. 8, the lateral vents 58 are shown as substantially linear perforations in the sides of the enclosure 46.

FIGS. 5–8 are merely intended to provide examples of various embodiments of the lateral vents 58, which apply equally to other vents in the module 14 and chassis 12, such as the front vents 54, rear vents 56, and vent plates 16, without in any way limiting the scope of the present invention. For instance, any of the vents formed in accordance with the present invention may include substantially circular, rectangular, elliptical, linear, and/or triangular perforations and/or cutouts while remaining within the scope of the present invention.

As shown in each of FIGS. 5–8, the enclosures 46 preferably include a rear panel 60, which covers the rear portion of the enclosure 46. One of two ATX I/O shields 62 is preferably affixed to the front portion of the enclosure 46 to provide a mounting surface for various electrical connectors as well as providing a grid for the front vent 54. A PCI expansion bracket 64 and a handlebar 20 are also preferably mounted to the front portion of the enclosure 46.

A case holder 66 is preferably mounted from side to side within the enclosure 46 to provide further structural integrity. Power supply brackets 68 are preferably mounted within the enclosure 46 to mount the power supply 48 shown in FIG. 4 to the enclosure 46. Hard disk drive trays 70 are also preferably mounted to the inside bottom portion of the enclosure 46 to affix the disk drives 50 shown in FIG. 4 to the enclosure 46.

Figure 9:
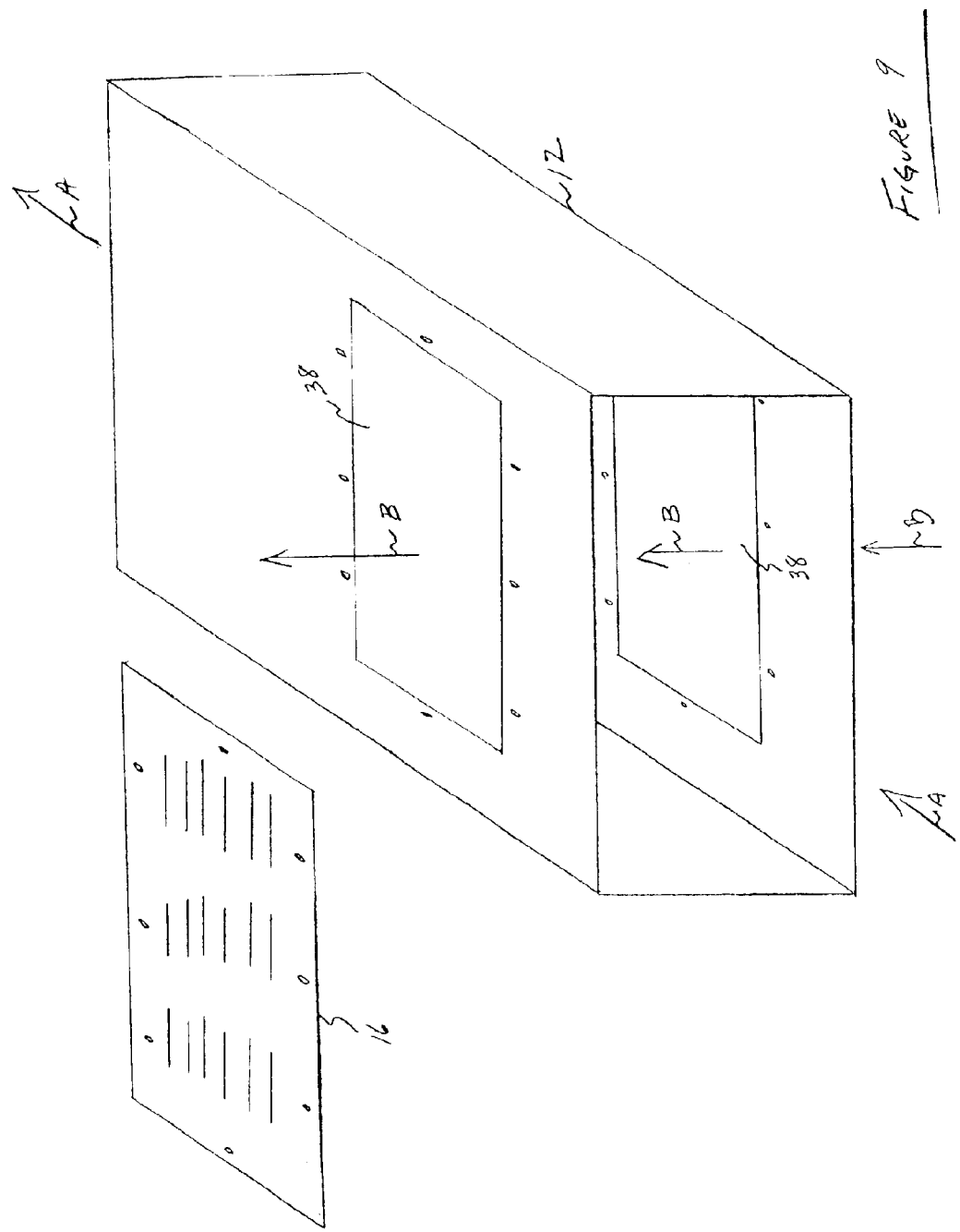
FIG. 9 is a front isometric view of the chassis formed in accordance with the present invention.

FIG. 9 shows a front isometric view of the chassis 12 formed in accordance with the present invention having the bottom and top vent panels 16 removed. The first airflow path preferably enters the front region of the enclosure 12, flows across the modules (not shown) in the chassis 12, and exits the rear of the chassis 12 by operation of the rear-mount fans 24 shown in FIG. 2. The second airflow path B preferably enters the bottom vent 38 of the enclosure 12, flows across the modules (not shown) in the chassis 12, and exits the top vent 38 of the enclosure 12.

Figure 10:
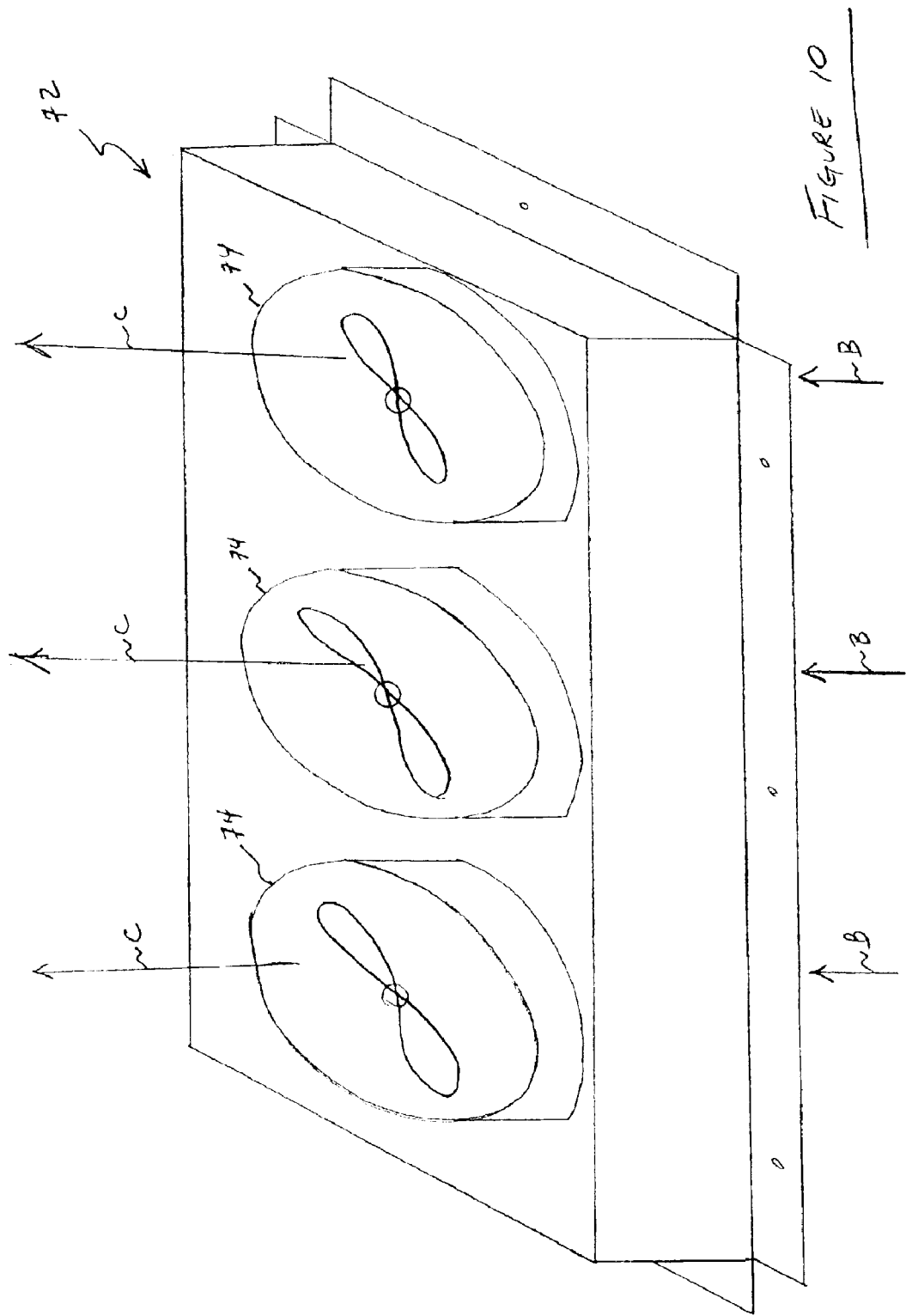
FIG. 10 is a top isometric view of a first embodiment of a top-mounted fan assembly formed in accordance with the present invention.

FIG. 10 shows a top isometric view of a first embodiment of a top-mounted fan assembly 72 formed in accordance with the present invention. The top-mounted fan assembly 72 is preferably mounted to the top surface of the chassis 12 after the vent panel 16 has been removed. The top-mounted fan assembly 72 preferably includes three fans 74, pressurized air blower units, and/or alternative devices for displacing air that are well known in the art, which direct air from the chassis 12 beneath the fan assembly 72, through the fans 74, and exhaust the air upwards from the fan assembly 72, as shown by arrows C.

Figure 11:
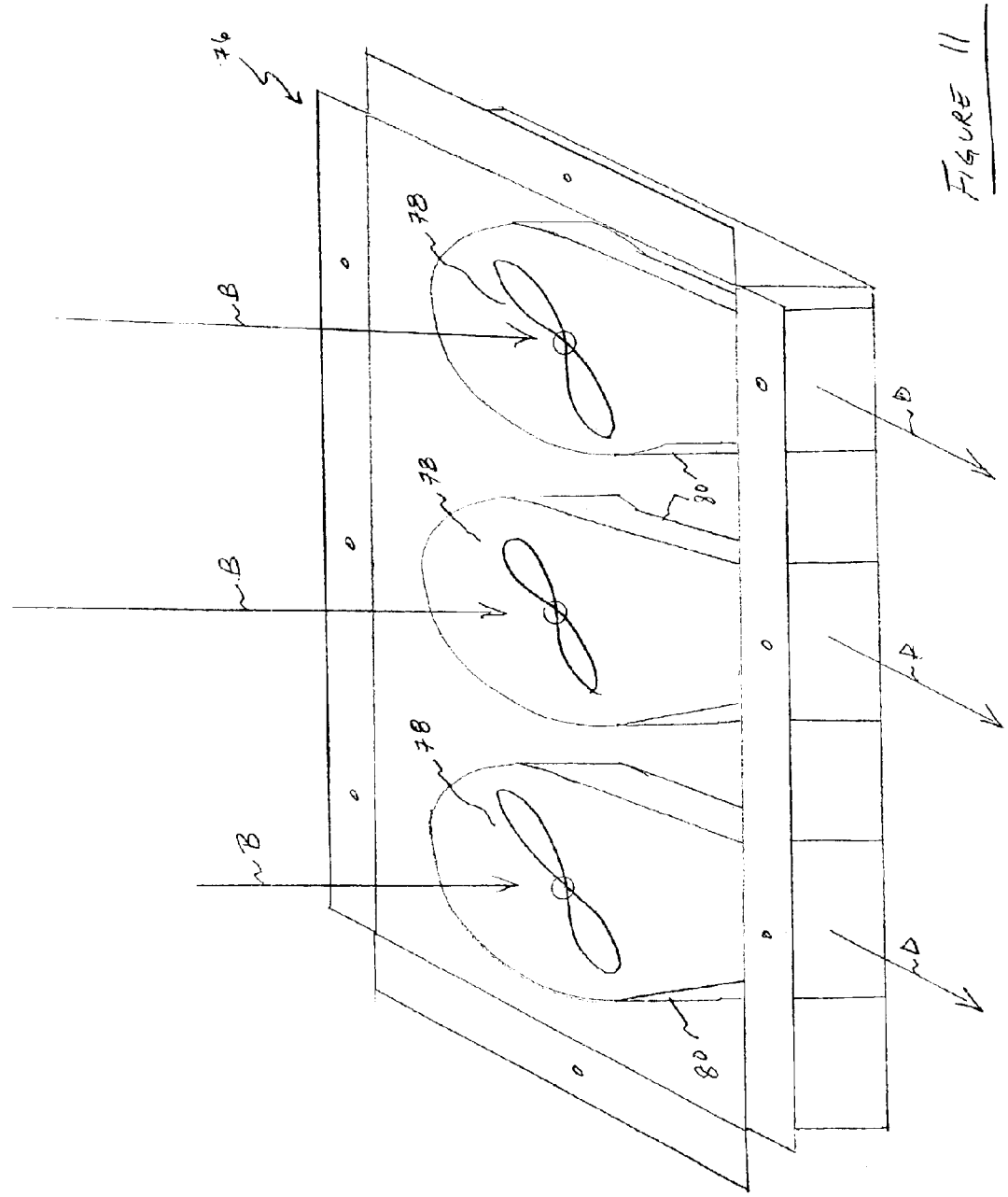
FIG. 11 is a bottom isometric view of a second embodiment of the top-mounted fan assembly formed in accordance with the present invention.

FIG. 11 shows a bottom isometric view of a second embodiment of the top-mounted fan assembly 76. The top-mounted fan assembly 76 is also preferably mounted to the top surface of the chassis 12 after the vent panel 16 has been removed. The second embodiment of the fan assembly 76 preferably includes three lateral exhaust fans 78 with baffles or cowls 80 to direct heated air from inside the chassis 12 up through the fan assembly 76 and out the rear of the fan assembly 76, as shown by arrows D.

FIG. 12 shows an isometric view of a plurality of chassis 12 stacked in substantially vertical alignment. As shown, the topmost chassis 12A preferably includes the top-mounted fan assembly 76 mounted to the top surface of the chassis 12A. The top-mounted fan assembly 76 preferably directs air from the second airflow path B through each of the upper and lower vents 38 of the vertically aligned chassis 12 and out the rear of the top-mounted fan assembly 76 towards the rear of the chassis 12A, as shown by arrows D. The first airflow path A, as described above is preferably directed from the front of each of the chassis 12, 12A to the rear of each of the chassis 12, 12A.

Thus, the chassis 12 and modules 14 formed in accordance with the present invention are preferably cascadable to provide a channel or chimney directed along the second airflow path B through each of the chassis 12, 12A for efficient cooling of the electrical components mounted within the modules 14. This chimney effect may be enhanced by positioning a gasket 77 between adjacent chassis 12 to seal the second airflow path B as it passes vertically from chassis to chassis.

Figure 13A:
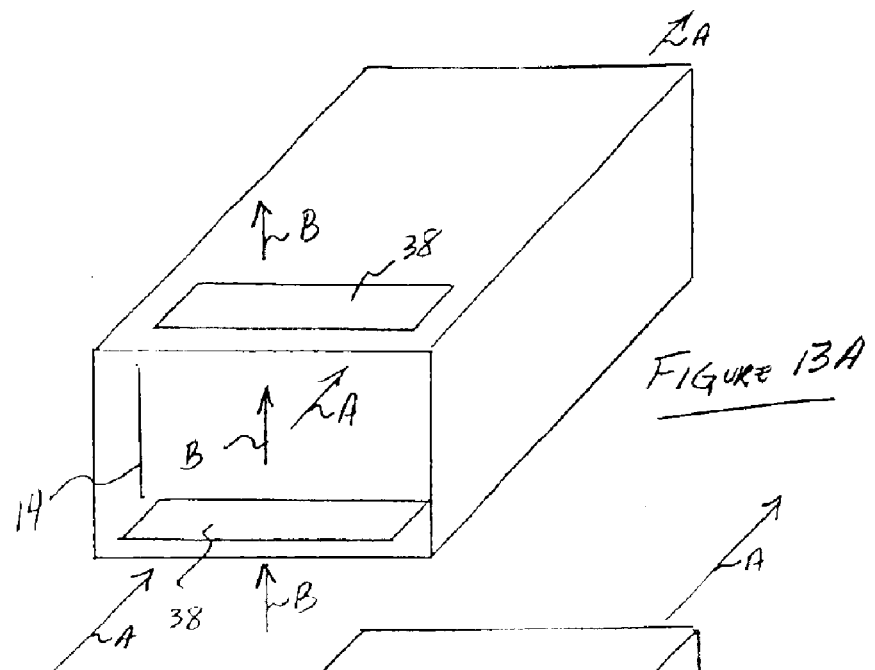
FIGS. 13A, 13B, and 13C show three embodiments of the chassis and module formed in accordance with the present invention.

FIG. 13A shows a first embodiment of the chassis 12 and module 14 formed in accordance with the present invention, as described above, in which the first airflow path A preferably flows from the front of the chassis 14 to the rear of the chassis 12, and the second airflow path B preferably flows from the bottom of the chassis 12 to the top of the chassis 12. The modules 14 are shown as preferably inserted into the front of the chassis 12 substantially parallel to the sides of the chassis 12. The chassis vents 38 are preferably on the top and bottom of the chassis 12 in the first embodiment.

Figure 13B:
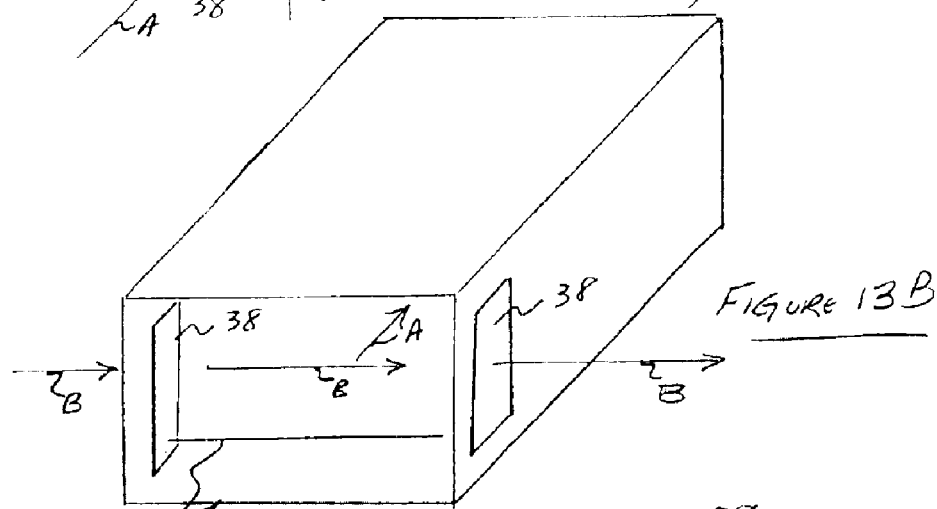

FIG. 13B shows a second embodiment of the chassis 12 and module 14 formed in accordance with the present invention, in which the first airflow path A preferably again flows from the front of the chassis 14 to the rear of the chassis 12, and the second airflow path B preferably flows from the left side of the chassis 12 to the right side of the chassis 12. The modules 14 are shown as preferably inserted into the front of the chassis 12 substantially parallel to the top and bottom of the chassis 12. The chassis vents are preferably on the right and left sides of the chassis 12 in the second embodiment.

Figure 13C:
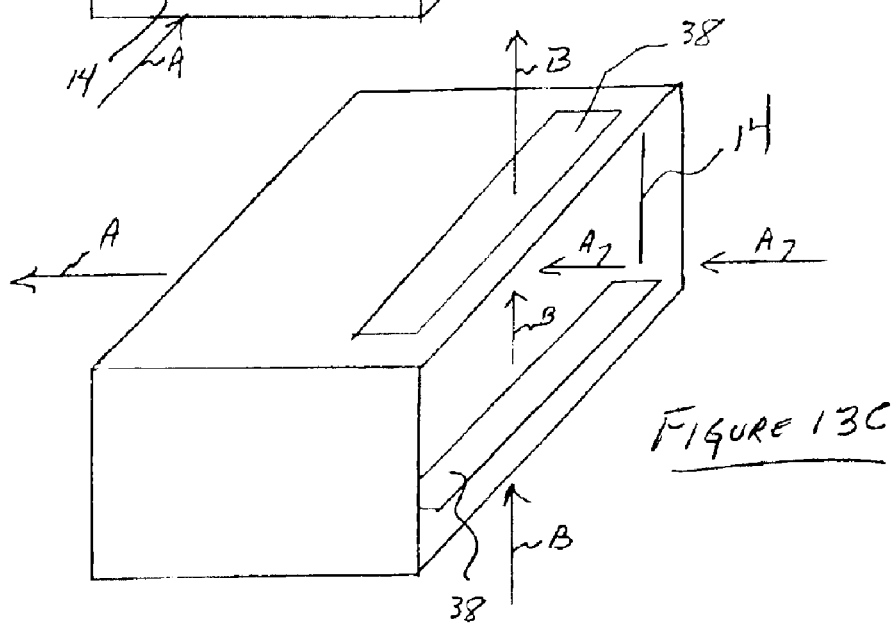

FIG. 13C shows a third embodiment of the chassis 12 and module 14 formed in accordance with the present invention, in which the first airflow path A preferably flows from the right side of the chassis 14 to the left side of the chassis 12, and the second airflow path B preferably flows from the bottom of the chassis 12 to the top of the chassis 12. The modules 14 are shown as preferably inserted into the right side of the chassis 12 substantially parallel to the rear of the chassis 12. The chassis vents 38 are preferably on the top and bottom of the chassis 12 in the third embodiment.

It is to be understood that the direction with respect to any of the airflow paths described above may be reversed, which may or may not involve relocating the associated fans, while remaining within the scope of the present invention.

Thus, the method, chassis, and module formed in accordance with the present invention promote efficient, effective, uniform, and thorough cooling of all components within a computer system, while eliminating dead spots in conventional airflow paths commonly created around oversized or high profile components and assemblies, such as power supplies and disk drives, in computer systems.

The method, chassis, and module formed in accordance with the present invention also provide dual airflow paths to cool all components mounted within the modules while creating an airflow path or chimney through a plurality of chassis stacked or cascaded in vertical alignment.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A computer system, which comprises:
    a housing including a first opening, a second opening, a third opening, and a fourth opening, the first opening opposing the second opening, the third opening opposing the fourth opening, each of the first, second, third, and fourth openings being disposed on different sides of the housing; and
    a circuit board adapted for positioning at least one electrical component thereon, the housing being adapted to enclose the circuit board, the housing including a first airflow path substantially directed across the circuit board along a first line from the first opening to the second opening, the housing including a second airflow path substantially directed across the circuit board along a second line from the third opening to the fourth opening, the first line intersecting the second line.

2. A computer system, as defined by claim 1, further comprising a first airflow circulator, the first airflow circulator being substantially in-line with the first airflow path.

3. A computer system, as defined by claim 1, further comprising a second airflow circulator, the second airflow circulator being substantially in-line with the second airflow path.

4. A computer system, as defined by claim 1, wherein the first opening is substantially disposed at a top region of the housing, the second opening being substantially disposed at a bottom region of the housing, the third opening of the housing being substantially disposed at a front region of the housing.

5. A computer system, as defined by claim 1, further comprising a module adapted to position the circuit board therein, the module including at least one opening disposed substantially in-line with at least one of the first airflow path and the second airflow path.

6. A computer system, as defined by claim 1, further comprising a module adapted to position the circuit board therein, the module being removably receivable in the housing.

7. A computer system, as defined by claim 1, wherein the cooling medium includes a gas.

8. A computer system, as defined by claim 3, wherein the second air circulator is adapted to be removably disposed within an enclosure at the first opening.

9. A computer system, as defined by claim 8, wherein the enclosure is adapted to direct airflow from the second airflow path towards a rear region of the housing.

10. A computer system, as defined by claim 1, further comprising a perforated plate, the perforated plate being adapted for covering at least one of the first opening and the second opening.

11. A computer system, as defined by claim 10, wherein perforations in the perforated plate are at least one of substantially circular, triangular, linear, rectangular, and elliptical.

12. A computer system, as defined by claim 10, wherein the perforated plate is adapted to be removably attached to the housing.

13. A computer system, as defined by claim 5, wherein the at least one opening of the module is formed by perforations in the module.

14. A computer system, as defined by claim 13, wherein the perforations are at least one of substantially circular, triangular, linear, rectangular, and elliptical.

15. A computer system, as defined by claim 1, wherein the first opening is substantially positioned at a rear region of the housing, and the second opening is substantially positioned at a front region of the housing.

16. A computer system, as defined by claim 1, wherein the first airflow path is substantially perpendicular to the second airflow path.

17. A computer system, as defined by claim 1, further comprising a module adapted to position the circuit board therein, the module being slidably receivable by the housing, the module including an external surface, the housing including an internal surface, the external surface of the module being in contact with the internal surface of the housing as the module is slidably received by the housing, a friction-reducing material being disposed between the external surface of the module and the internal surface of the housing.

18. A computer system, as defined by claim 17, wherein the friction-reducing material including at least one of silicone and Teflon® tape, the at least one of silicone and Teflon® tape being positioned on at least one of the external surface of the module and the internal surface of the housing.

19. A computer system, as defined by claim 1, wherein the computer system further comprises a plurality of housings, the second airflow path of each of the plurality of housings forming a third airflow path through the plurality of housings when the plurality of housings are placed in substantial vertical alignment.

20. A computer system, as defined by claim 19, wherein the computer system further comprises a gasket positioned between adjacent housings to substantially seal the second airflow path as it passes between adjacent housings of the plurality of housings.

21. A computer system, as defined by claim 19, further comprising a second air circulator, wherein the plurality of housings include an uppermost housing, the second air circulator being positioned substantially in-line with the third airflow path at a top region of the uppermost housing.

22. A computer system housing, which comprises:
a housing, including a first opening, a second opening, a third opening, and a fourth opening, the first opening opposing the second opening, the third opening opposing the fourth opening, the housing being adapted to enclose a circuit board, the circuit board being adapted for positioning at least one electrical component thereon, each of the first, second, third, and fourth openings being disposed on different sides of the housing;
a first airflow path substantially directed across the circuit board along a first line from the first opening to the second opening, and
a second airflow path substantially directed across the circuit board along a second line from the third opening to the fourth opening, the first line intersecting the second line.

23. A computer system housing, as defined by claim 22, further comprising a first airflow circulator, the first airflow circulator being substantially in-line with the first airflow path.

24. A computer system housing, as defined by claim 22, further comprising a second airflow circulator, the second airflow circulator being substantially in-line with the second airflow path.

25. A computer system housing, as defined by claim 22, wherein the first opening is substantially disposed at a top region of the housing, the second opening being substantially disposed at a bottom region of the housing, the third opening of the housing being substantially disposed at a front region of the housing.

26. A computer system housing, as defined by claim 22, wherein the housing is adapted to permit a module including the circuit board to be removably receivable therein.

27. A computer system housing, as defined by claim 22, wherein the cooling medium includes a gas.

28. A computer system housing, as defined by claim 24, wherein the second air circulator is adapted to be removably disposed within an enclosure at the first opening.

29. A computer system housing, as defined by claim 28, wherein the enclosure is adapted to direct airflow from the second airflow path towards a rear region of the housing.

30. A computer system housing, as defined by claim 22, further comprising a perforated plate, the perforated plate being adapted for covering at least one of the first opening and the second opening.

31. A computer system housing, as defined by claim 30, wherein perforations in the perforated plate are at least one of substantially circular, triangular, linear, rectangular, and elliptical.

32. A computer system housing, as defined by claim 30, wherein the perforated plate is adapted to be removably attached to the housing.

33. A computer system housing, as defined by claim 22, wherein the first opening and the second opening are substantially positioned at a front region of the housing.

34. A computer system housing, as defined by claim 22, wherein the first airflow path is substantially perpendicular to the second airflow path.

35. A computer system housing, as defined by claim 22, wherein the housing is adapted to slidably receive a module, the module including the circuit board, the module including an external surface, the housing including an internal surface, the external surface of the module being in contact with the internal surface of the housing as the housing slidably receives the module, a friction-reducing material being disposed between the external surface of the module and the internal surface of the housing.

36. A computer system housing, as defined by claim 35, wherein the friction-reducing material including at least one of silicone and Teflon® tape, the at least one of silicone and Teflon® tape being positioned on the internal surface of the housing.

37. A method of cooling a computer system, which comprises the steps of:
forming a housing, the housing including a first opening, a second opening, a third opening, and a fourth opening, the first opening opposing the second opening, the third opening opposing the fourth opening, each of the first, second, third, and fourth openings being disposed on different sides of the housing;
providing a circuit board adapted for positioning at least one electrical component thereon, the housing being adapted to enclose the circuit board;
providing a first airflow path substantially directed across the circuit board along a first line from the first opening to the second opening; and
providing a second airflow path substantially directed across the circuit board along a second line from the third opening to the fourth opening, the first line intersecting the second line.

38. A method of cooling a computer system, as defined by claim 37, further comprising the step of providing a first airflow circulator substantially in-line with the first airflow path.

39. A method of cooling a computer system, as defined by claim 37, further comprising the step of providing a second airflow circulator substantially in-line with the second airflow path.

40. A method of cooling a computer system, as defined by claim 37, further comprising the steps of:
disposing the first opening substantially at a top region of the housing;
disposing the second opening substantially at a bottom region of the housing; and
disposing the third opening of the housing substantially at a front region of the housing.

41. A method of cooling a computer system, as defined by claim 37, further comprising the steps of:
providing a module adapted to receive the circuit board, the module being receivable in the housing; and
providing at least one opening on the module disposed substantially in-line with at least one of the first airflow path and the second airflow path.

42. A method of cooling a computer system, as defined by claim 37, further comprising the steps of:
providing a module adapted to receive the circuit board, the module being receivable in the housing; and adapting the module for being removably receivable by the housing.

43. A method of cooling a computer system, as defined by claim 37, further comprising the step of including gas in the cooling medium.

44. A method of cooling a computer system, as defined by claim 39, further comprising the step of disposing the second air circulator removably within an enclosure at the first opening.

45. A method of cooling a computer system, as defined by claim 37, further comprising the step of directing airflow from the second airflow path towards a rear region of the housing.

46. A method of cooling a computer system, as defined by claim 37, further comprising the step of covering at least one of the first opening and the second opening with a perforated plate.

47. A method of cooling a computer system, as defined by claim 46, further comprising the step of perforating the perforated plate with at least one of substantially circular, triangular, linear, rectangular, and elliptical perforations.

48. A method of cooling a computer system, as defined by claim 46, further comprising the step of attaching the perforated plate removably to the housing.

49. A method of cooling a computer system, as defined by claim 41, further comprising the step of perforating the module with at least one of substantially circular, triangular, linear, rectangular, and elliptical perforations to form the at least one opening of the module.

50. A method of cooling a computer system, as defined by claim 37, further comprising the step of positioning the first opening and the second opening substantially at a front region of the housing.

51. A method of cooling a computer system, as defined by claim 37, further comprising the step of positioning the first airflow path substantially perpendicular to the second airflow path.

52. A method of cooling a computer system, as defined by claim 37, further comprising the steps of:
   providing a plurality of housings; and
   stacking the plurality of housings in substantially vertical alignment, the second airflow path of each of the plurality of housings forming a third airflow path through the plurality of housings when the plurality of housings is placed in substantially vertical alignment.

53. A method of cooling a computer system, as defined by claim 52, further comprising the steps of:
   providing a second air circulator, the plurality of housings including an uppermost housing; and
   positioning the second air circulator substantially in-line with the third airflow path at a top region of a topmost housing.

* * * * *